US008487232B2

(12) United States Patent
Iwamoto et al.

(10) Patent No.: US 8,487,232 B2
(45) Date of Patent: Jul. 16, 2013

(54) SOLID STATE IMAGE SENSOR ADAPTED TO REMOVE NOISE

(75) Inventors: Tsuyoshi Iwamoto, Nishinomiya (JP); Satoshi Masuda, Neyagawa (JP); Masayuki Kusuda, Kobe (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 417 days.

(21) Appl. No.: 12/710,927

(22) Filed: Feb. 23, 2010

(65) Prior Publication Data

US 2010/0213351 A1 Aug. 26, 2010

(30) Foreign Application Priority Data

Feb. 25, 2009 (JP) ................................. 2009-042570

(51) Int. Cl.
*H01L 27/00* (2006.01)
*H04N 3/14* (2006.01)
(52) U.S. Cl.
USPC ....................................... 250/208.1; 348/308
(58) Field of Classification Search
USPC .................... 250/208.1; 348/295, 308, 241
See application file for complete search history.

(56) References Cited

U.S. PATENT DOCUMENTS

| 6,476,864 | B1 * | 11/2002 | Borg et al. ................... 348/245 |
| 2003/0006364 | A1 * | 1/2003 | Katzir et al. ............... 250/208.1 |
| 2006/0132634 | A1 | 6/2006 | Kudoh |
| 2007/0013798 | A1 * | 1/2007 | Ahn et al. ..................... 348/308 |
| 2008/0258047 | A1 * | 10/2008 | Sakakibara et al. ...... 250/214 C |
| 2009/0090845 | A1 * | 4/2009 | Yin et al. ................... 250/208.1 |
| 2009/0108176 | A1 * | 4/2009 | Blanquart ................. 250/208.1 |
| 2010/0208110 | A1 | 8/2010 | Kudoh |

FOREIGN PATENT DOCUMENTS

| JP | 2003-009003 | 1/2003 |
| JP | 2006-174325 | 6/2006 |
| JP | 2007-336519 A | 12/2007 |
| JP | 2009-017218 | 1/2009 |

OTHER PUBLICATIONS

Feature and Usage of Backside Incident Type TDI-CCD by Hamamatsu Photonics KK, Apr. 2007, with the Japanese language PDF document located at URL:http://ip.hamamatsu.com/resources/products/ssd/pdf/tdi-ccd_kmpd9004101.pdf.
"Features of Back-thinned TDI-CCD" by Hamamatsu Photonics KK, published prior to Feb. 16, 2009.
English Translation of an Office Action issued on Nov. 13, 2012 in the corresponding Japanese Patent Application No. 2009-042570.

* cited by examiner

*Primary Examiner* — Thanh Luu
(74) *Attorney, Agent, or Firm* — Cozen O'Connor (57) ABSTRACT

A solid state image sensor and an image sensing apparatus incorporated with the solid state image sensor include: pixel arrays each provided with pixels, and an accumulating section e.g. a capacitor CX which sums up and accumulates signal charges obtained by exposure of an object with respect to a corresponding color at different timings when the signal charges are obtained by the pixels of each of the pixel arrays. A reset noise of a converting floating diffusion is outputted after the converting floating diffusion is reset. Thereafter, a summation of the reset noise, and the signal charges accumulated in the accumulating section is outputted.

3 Claims, 7 Drawing Sheets

SOLID STATE IMAGE SENSOR ADAPTED TO REMOVE NOISE

Priority is claimed on Japanese Patent Application No. 2009-042570, filed on Feb. 25, 2009, the contents of which are hereby incorporated by reference.

BACKGROUND OF THE INVENTION AND RELATED ART STATEMENT

1. Field of the Invention

The present invention relates to a CMOS solid state image sensor, and an image sensing apparatus incorporated with the solid state image sensor.

2. Description of the Related Art

Conventionally, there is known a document reading device provided with a CMOS image sensor, wherein plural pixel arrays for receiving light of R (red), G (green), and B (blue) i.e. plural one-dimensional pixel arrays are arranged in rows. In the document reading device, a scanning operation is performed by mechanically moving a CMOS image sensor, an imaging optics, or a document. In performing the scanning operation, if an operation error such as feeding displacement occurs, each of the pixel arrays may read an image at a displaced position, with the result that serious color displacement may be generated in a reproduced image. In view of this, for instance, JP 2007-336519A (D1) proposes a CMOS image sensor of a simplified arrangement, wherein the pitch between one-dimensional pixel arrays is reduced, to suppress color displacement in a reproduced image resulting from generation of feeding displacement by a scanning operation.

The conventional CMOS image sensor recited in D1 is provided with a pixel circuit including a light receiving element, a transfer transistor, a reset transistor, a floating diffusion (FD), an amplification transistor, and a row selecting transistor in each of the pixels. In this arrangement, since a large area is used for the pixel circuits provided in the pixels, if an area of openings for receiving light by the light receiving elements is increased, the area of the pixels may be increased. In the CMOS image sensor, for instance, in the case where adjacent pixel arrays are arranged in proximity to each other, if the area of each pixel is increased, the pitch between the pixel arrays is also increased, because the size of a pixel corresponds to a pitch between pixel arrays. Thus, as described above, the size of a pixel is reduced by a decrease in the pitch between pixel arrays, with the result that the area of the openings for receiving light is also reduced. As a result, it is impossible to receive sufficient amount of light, and the sensitivity of the CMOS image sensor may be deteriorated.

In view of the above, there is known a CMOS image sensor provided with plural rows of pixel arrays adapted to receive light of a corresponding color component (spectral characteristic) with respect to an object, and adapted to perform a TDI (Time Delay Integration) operation. The TDI operation is a readout operation with respect to an identical frame, while time-wise shifting the pixel arrays row by row. The solid state image sensor having the above arrangement has a drawback that it is sometimes impossible to properly remove a reset noise of a floating diffusion included in a signal to be obtained by the readout operation.

SUMMARY OF THE INVENTION

In view of the above conventional examples, it is an object of the present invention to provide a solid state image sensor that enables to perform an image sensing operation by using a TDI operation with removing a reset noise in resetting a floating diffusion (FD), and an image sensing apparatus incorporated with the solid state image sensor.

A solid state image sensor and an image sensing apparatus incorporated with the solid state image sensor according to an aspect of the invention includes: pixel arrays each provided with pixels, and an accumulating section which sums up and accumulates signal charges obtained by exposure of an object with respect to a corresponding color at different timings by the pixels of each of the pixel arrays. A reset noise of a converting floating diffusion is outputted after the converting floating diffusion is reset. Thereafter, a summation of the reset noise, and the signal charges accumulated in the accumulating section is outputted. Accordingly, the inventive solid state image sensor and the inventive image sensing apparatus incorporated with the solid state image sensor are operable to perform an image sensing operation using a TDI operation with removing a reset noise generated at the time of resetting the FD.

These and other objects, features and advantages of the present invention will become more apparent upon reading the following detailed description along with the accompanying drawings.

DETAILED DESCRIPTION OF THE PREFERRED EMBODIMENTS OF THE INVENTION

In the following, embodiments of the invention are described referring to the drawings. Elements with like reference numerals throughout the drawings have like arrangements, and repeated description thereof is omitted, as necessary.

First Embodiment

Figure 1:
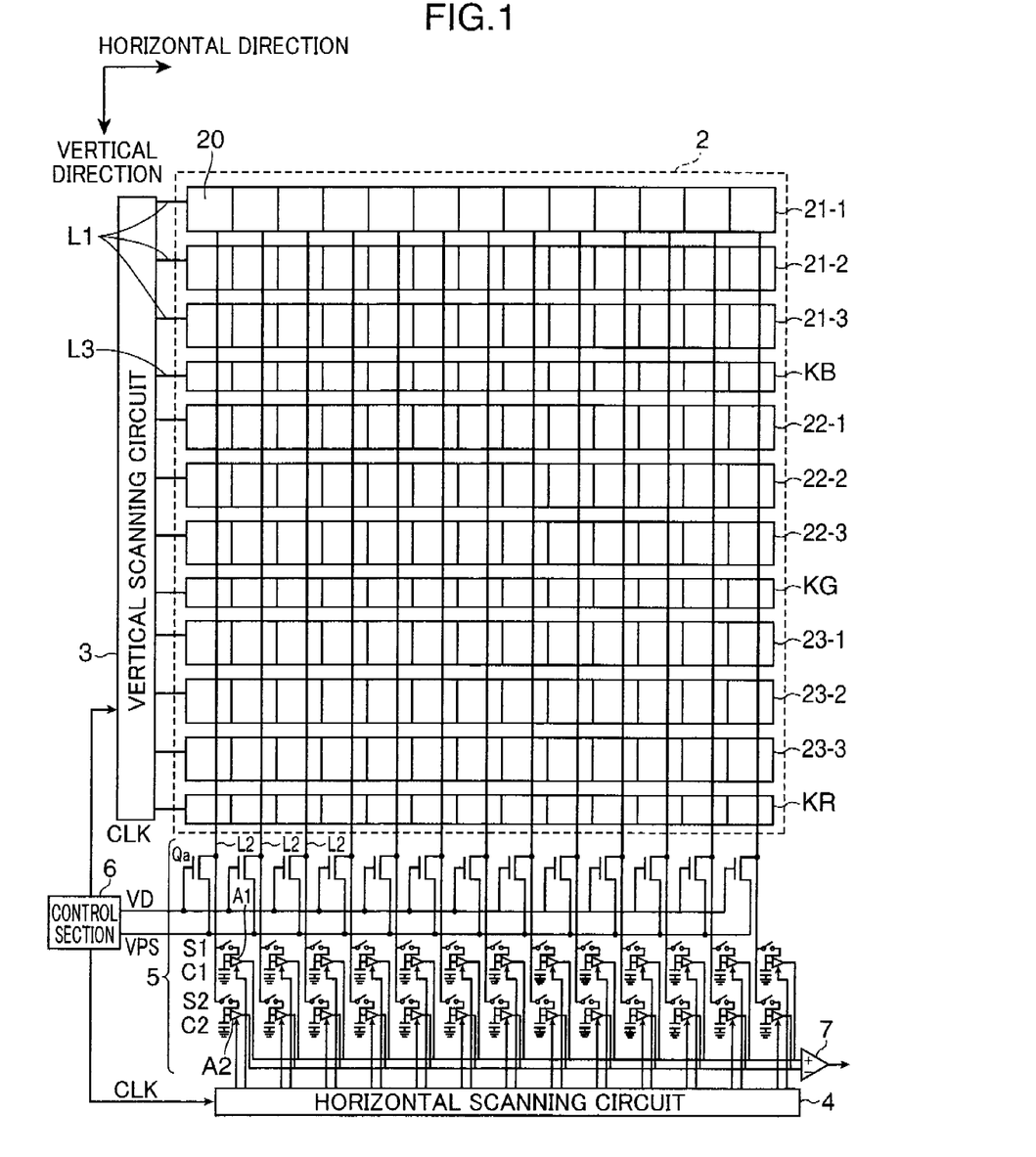
FIG. 1 is schematic diagram showing an overall arrangement of an image sensing apparatus in accordance with a first embodiment of the invention.

FIG. 1 is a schematic diagram showing an overall arrangement of an image sensing apparatus in accordance with the first embodiment. The image sensing apparatus 1 in the first embodiment includes, for instance, as shown in FIG. 1, pixel arrays 2, a vertical scanning circuit 3, a horizontal scanning circuit 4, readout circuits 5, a control section 6, and a differential amplifier 7. The readout circuits 5 and the differential amplifier 7 constitute a CDS (Correlated Double Sampling) circuit. The image sensing apparatus 1 is adapted to e.g. scan an object such as a document which is relatively moving in a sub scan direction, or scan an object by moving the pixel arrays 2 relative to the object in a stationary state in the sub scan direction.

A solid state image sensor is constituted of the elements shown in FIG. 1 except for the control section 6, in other words, is constituted of the pixel arrays 2, the vertical scanning circuit 3, the horizontal scanning circuit 4, the readout circuits 5, and the differential amplifier 7. In the case where the image sensing apparatus shown in FIG. 1 is formed into a one-chip including the control section 6, the solid state image sensor may have the arrangement shown in FIG. 1.

The pixel arrays 2 are CMOS pixel arrays including pixel arrays 21-1 through 21-3, 22-1 through 22-3, and 23-1 through 23-3. The pixel arrays 21-1 through 21-3, 22-1 through 22-3, and 23-1 through 23-3 are each a sensor, wherein plural pixels 20 are linearly arranged in a main scan direction (column direction). The pixel arrays 21-1 through 21-3, 22-1 through 22-3, 23-1 through 23-3 are attached with color filters of B (Blue), G (Green), and R (Red) at openings of the pixels 20 to read out pixel signals of B, G, and R, respectively. In other words, in reading out pixel signals of B, G, and R by the image sensing apparatus 1 of the first embodiment, each three rows of the pixel arrays perform a readout operation with respect to a corresponding color, using a TDI operation. More specifically, each three rows of the pixel arrays receive light of a corresponding color with respect to an identical frame row by row, while shifting a readout time. In the first embodiment, since the number of pixel arrays corresponding to each of the colors is three, a readout operation is performed three times.

A common circuit KB provided with circuit elements each used in common with respect to each of the columns of the pixels 20 of the pixel arrays 21-1 through 21-3 is provided between the pixel array 21-3 and the pixel array 22-1. A common circuit KG provided with circuit elements each used in common with respect to each of the columns of the pixels 20 of the pixel arrays 22-1 through 22-3 is provided between the pixel array 22-3 and the pixel array 23-1. A common circuit KR provided with circuit elements each used in common with respect to each of the columns of the pixels 20 of the pixel arrays 23-1 through 23-3 is provided at a position adjacent to the pixel array 23-3.

The vertical scanning circuit 3 is connected to the pixel arrays 21-1 through 21-3, 22-1 through 22-3, and 23-1 through 23-3 through respective corresponding row selecting signal lines L1. The vertical scanning circuit 3 cyclically outputs, to the pixel arrays 21-1 through 21-3, 22-1 through 22-3, and 23-1 through 23-3, a row selecting signal for selecting each row of the pixel arrays 2 downwardly or upwardly in the sub scan direction in accordance with a clock signal CLK to be outputted from the control section 6, whereby each row of the pixel arrays 2 is scanned. The vertical scanning circuit 3 is connected to the common circuits KB, KG, and KR through respective corresponding color selecting signal lines L3. The control section 6 cyclically outputs, to the common circuits KB, KG, and KR, a color selecting signal for selecting a pixel signal out of B, G, and R pixel signals through the corresponding color selecting signal line L3, whereby each row of the pixel arrays 2 is scanned. In the first embodiment, the vertical scanning circuit 3 is constituted of a shift register. Alternatively, the vertical scanning circuit 3 may be constituted of a random access circuit.

The horizontal scanning circuit 4 is constituted of e.g. a shift register, and cyclically outputs, to the readout circuits 5, a column selecting signal for selecting each column of the pixel arrays 2 in accordance with the clock signal CLK to be outputted from the control section 6 to scan the readout circuits 5 in e.g. rightward direction or leftward direction. The same number of signal lines L2 as columns of the pixel arrays 2 are provided. Each of the vertical signal lines L2 is connected to the nine pixels 20 in the corresponding column through the common circuits KB, KG, and KR.

The readout circuits 5 are provided in common with respect to the pixels 20 in each column of the pixel arrays 2, and read the pixel signals from the pixel arrays 21-1 through 21-3, 22-1 through 22-3, and 23-1 through 23-3 through the respective corresponding vertical signal lines L2. In this embodiment, each of the readout circuits 5 is provided with a load transistor Qa, a signal sample-and-hold switch S1, a noise sample-and-hold switch S2, a signal sample-and-hold capacitor C1, a noise sample-and-hold capacitor C2, and amplifiers A1 and A2.

The load transistor Qa is constituted of e.g. a field effect transistor, and functions as a load in response to application of a load voltage signal VD to a gate thereof from the control section 6.

The noise sample-and-hold switch S2 is turned on and off under the control of the control section 6, and reads out a noise component in a pixel signal of the pixel 20 corresponding to the color selected by the vertical scanning circuit 3, in the case where the noise sample-and-hold switch S2 is turned on, whereby the noise component is sampled-and-held by the noise sample-and-hold capacitor C2. Specifically, the noise component corresponds to a reset noise (kTC noise) of a floating diffusion in the common circuit KB, KG, KR with respect to the selected pixel 20. The amplifier A2 outputs a noise component sampled-and-held by the noise sample-and-hold capacitor C2 to the differential amplifier 7 in accordance with a column selecting signal to be outputted from the horizontal scanning circuit 4.

The signal sample-and-hold switch S1 is turned on and off under the control of the control section 6, and reads out a summation of a noise component and a signal component in the pixel signal from the pixel 20 corresponding to the color selected by the vertical scanning circuit 3, in the case where the signal sample-and-hold switch S1 is turned on, whereby the summation of the noise component and the signal component is sampled-and-held by the signal sample-and-hold capacitor C1. Specifically, the above noise component corresponds to a reset noise of a floating diffusion in the common circuit KB, KG, KR with respect to the selected pixel 20; and the above signal component corresponds to a pixel signal read out from the pixels 20 of three rows corresponding to the selected color. The amplifier A1 outputs, to the differential amplifier 7, the summation of the noise component and the signal component which has been sampled-and-held by the signal sample-and-hold capacitor C1 in accordance with a column selecting signal to be outputted from the horizontal scanning circuit 4. The differential amplifier 7 removes the noise component from the pixel signal by subtracting the noise component outputted from the amplifier A2, from the summation of the noise component and the signal component which has been outputted from the amplifier A1; and outputs the subtraction result to e.g. an unillustrated A/D converting section provided posterior to the differential amplifier 7.

The control section 6 is constituted of a microcomputer including a dedicated hardware circuit, a CPU (Central Processing Unit), an ROM (Read Only Memory), and an RAM (Random Access Memory), and controls overall operations of the image sensing apparatus 1 by respectively controlling the operations of the parts of the image sensing apparatus 1 in accordance with the respective corresponding functions. Thereby, the control section 6 controls an image sensing operation of the solid state image sensor for sensing a light image of an object.

Figure 2:
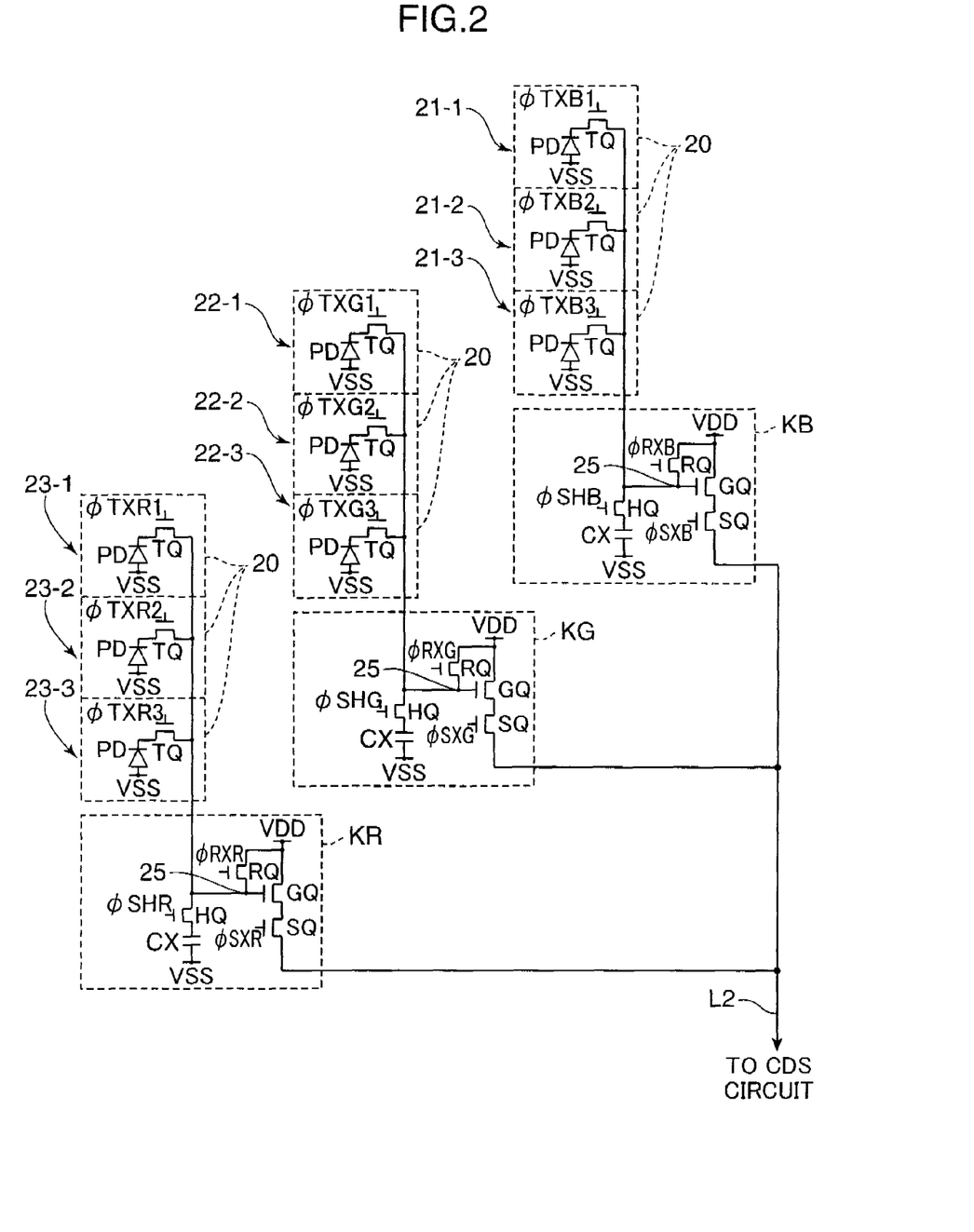
FIG. 2 is a circuit diagram of pixels of the image sensing apparatus shown in FIG. 1.

Next, a circuit configuration of the pixels of the image sensing apparatus in the first embodiment is described referring to FIG. 2. FIG. 2 is a circuit diagram of the pixels of the image sensing apparatus in the first embodiment of the invention. Referring to FIG. 2, each of the pixels 20 included in the pixel arrays 21-1 through 21-3, 22-1 through 22-3, and 23-1 through 23-3 has a photoelectric conversion element PD and a transfer transistor TQ. The photoelectric conversion element PD has an anode being grounded, and a cathode being connected to the source of the transfer transistor TQ. The electric potential of the anode of the photoelectric conversion element PD is set to a ground potential VSS. The gate of the transfer transistor TQ is connected to the vertical scanning circuit 3 through the corresponding row selecting signal line L1. The photoelectric conversion element PD receives light from the object, and accumulates a signal charge in accordance with the amount of received light. The transfer transistor TQ transfers the signal charge accumulated in the photoelectric conversion element PD.

The drain of the transfer transistor TQ in each of the pixels 20 of the pixel arrays 21-1 through 21-3 is connected to the common circuit KB. The drain of the transfer transistor TQ in each of the pixels 20 of the pixel arrays 22-1 through 22-3 is connected to the common circuit KG. The drain of the transfer transistor TQ in each of the pixels 20 of the pixel arrays 23-1 through 23-3 is connected to the common circuit KR.

Signals ϕTXB1 through ϕTXB3, as row selecting signals, for controlling on/off of the transfer transistor TQ are inputted to the gate of the transfer transistor TQ in each of the pixels 20 of the pixel arrays 21-1 through 21-3 for reading out pixel signals of B. Signals ϕTXG1 through ϕTXG3, as row selecting signals, for controlling on/off of the transfer transistor TQ are inputted to the gate of the transfer transistor TQ in each of the pixels 20 of the pixel arrays 22-1 through 22-3 for reading out pixel signals of G. Signals ϕTXR1 through ϕTXR3, as row selecting signals, for controlling on/off of the transfer transistor TQ are inputted to the gate of the transfer transistor TQ in each of the pixels 20 of the pixel arrays 23-1 through 23-3 for reading out pixel signals of R.

Each of the common circuits KB, KG, and KR is provided with an accumulation transistor HQ constituted of e.g. an NMOS, a capacitor (capacitor element) CX as a capacitor portion, a reset transistor RQ, an amplification transistor GQ, and a color selecting transistor SQ. The drain of the reset transistor RQ and the gate of the amplification transistor GQ are connected to each other, and constitute an FD (floating diffusion) 25. The pixel arrays 21-1 through 21-3, 22-1 through 22-3, and 23-1 through 23-3 are connected to the respective corresponding FDs 25. Each of the FDs 25 is connected to the source of the corresponding accumulation transistor HQ. The drain of the accumulation transistor HQ is connected to the other end of the capacitor CX whose one end is grounded. The electric potential of the one end of the capacitor CX is set to a ground potential VSS. The gate of the accumulation transistor HQ is connected to the control section 6 through the corresponding color selecting signal line L3, and signals ϕSHB, ϕSHG, and ϕSHR to be outputted from the control section 6, and for turning on/off the accumulation transistor HQ are inputted to the gate of the accumulation transistor HQ.

The gate of the reset transistor RQ is connected to the control section 6 through the corresponding color selecting signal line L3, and signals ϕRXB, ϕRXG, and ϕRXR to be outputted from the control section 6, and for turning on/off the reset transistor RQ are inputted to the gate of the reset transistor RQ. A drive voltage VDD is inputted to the source of the reset transistor RQ. The drive voltage VDD is outputted from an unillustrated voltage source, and the signals ϕRXB, ϕRXG, and ϕRXR are outputted from e.g. the control section 6. The FD 25 is reset in response to an operation of the reset transistor RQ.

The gate of the amplification transistor GQ is connected to the transfer transistor TQ and the reset transistor RQ through the FD 25. A drive voltage VDD is inputted to the source of the amplification transistor GQ. The drain of the amplification transistor GQ is connected to the source of the color selecting transistor SQ. The gate of the color selecting transistor SQ is connected to the control section 6 through the corresponding color selecting signal line L3, and signals ϕSXB, ϕSXG, and ϕSXR to be outputted from the control section 6, and for turning on/off the color selecting transistor SQ are inputted to the gate of the color selecting transistor SQ. The drain of the color selecting transistor SQ is connected to the corresponding vertical signal line L2, and is connected to the CDS circuit constituted of the readout circuits 5 and the differential amplifier 7.

Observing an operation with respect to B (Blue) color, the pixel arrays 21-1 through 21-3 correspond to an example of pixel arrays, the capacitor CX corresponds to an example of an accumulating section, the FD 25 corresponds to an example of a converting floating diffusion, the reset transistor RQ corresponds to an example of a reset transistor, and the amplification transistor GQ corresponds to an example of an amplification transistor.

Figure 3:
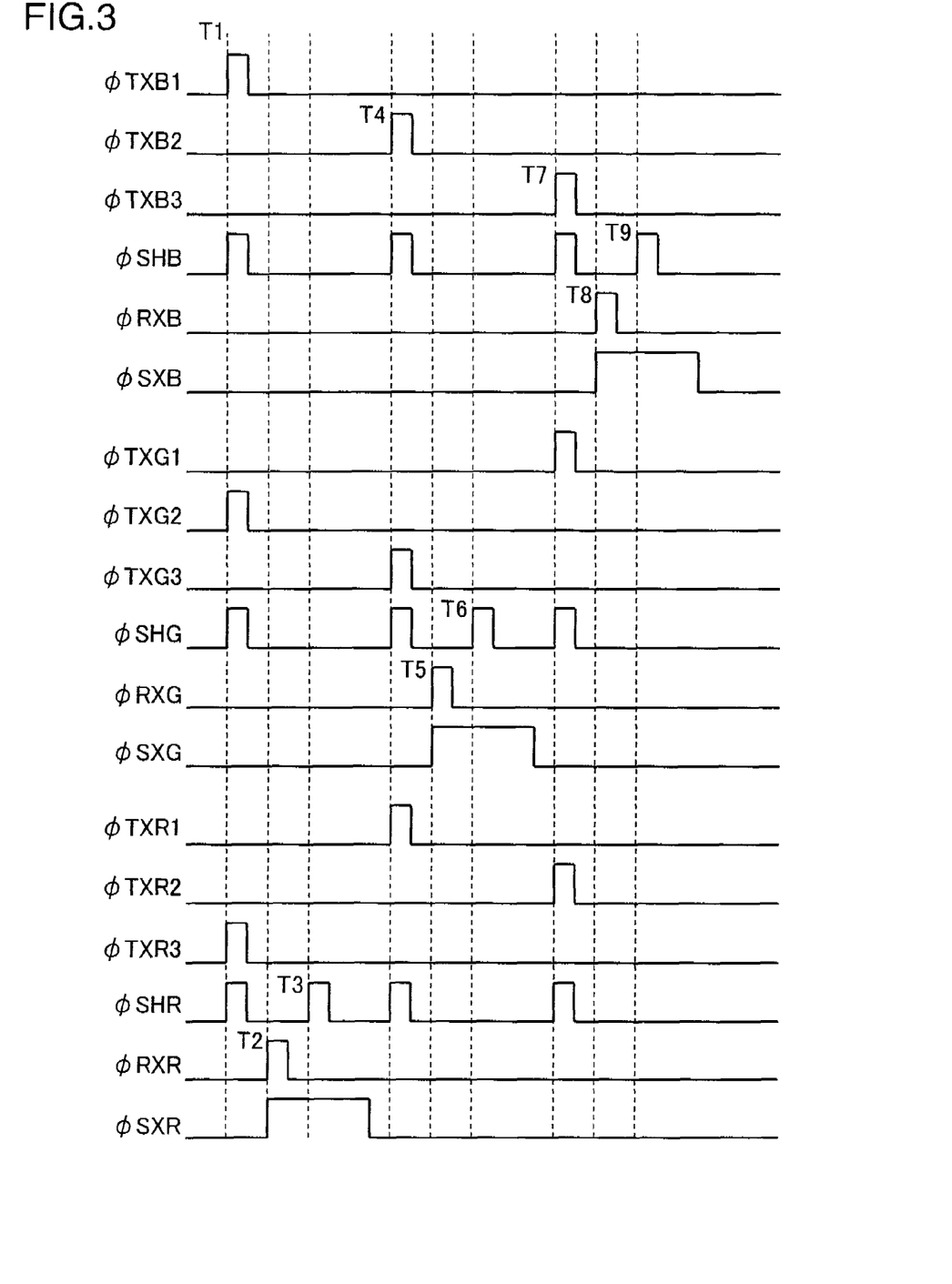
FIG. 3 is a timing chart of signals in the image sensing apparatus shown in FIG. 1.

An operation to be performed by the circuit configuration as described above is described referring to FIG. 3. FIG. 3 is a timing chart of signals in the image sensing apparatus of the first embodiment of the invention. First, a readout operation with respect to pixel signals of B is described. The pixel array 21-1 at the first row of the pixel arrays 21-1 through 21-3 for reading out pixel signals of B reads out a light signal. Specifically, a photoelectric conversion element PD in the pixel array 21-1 receives a light signal, performs a photoelectric conversion operation with respect to the light signal, and accumulates the received light signal as a signal charge. At the timing T1 when the signals ϕTXB1 and ϕSHB are turned on by the control section 6, the signal charge accumulated in the photoelectric conversion element PD is accumulated in the FD 25 through the transfer transistor TQ, and then accumulated in the capacitor CX through the accumulation transistor HQ. Thereafter, the pixel array 21-2 at the second row reads out a light signal with respect to the same frame as the frame for which the pixel array 21-1 has performed a readout operation with a time lag from the timing when the light signal has been readout by the pixel array 21-1. Specifically, a photoelectric conversion element PD in the pixel array 21-2 receives a light signal, performs a photoelectric conversion operation with respect to the received light signal, and accumulates the light signal as a signal charge. Then, at the timing T4 when the signals ϕTXB2 and ϕSHB are turned on by the control section 6, the signal charge accumulated in the photoelectric conversion element PD is accumulated in the FD 25 through the transfer transistor TQ, and then accumulated in the capacitor CX through the accumulation transistor HQ. Thereafter, the pixel array 21-3 at the third row reads out a light signal with respect to the same frame as the frame for which the pixel arrays 21-1 and 21-2 have performed a readout operation with a time lag from the timing when the light signals have been read out by the pixel arrays 21-1 and 21-2. Specifically, a photoelectric conversion element PD in the pixel array 21-3 receives a light signal, performs a photoelectric conversion operation with respect to the received light signal, and accumulates the light signal as a signal charge. Then, at the timing T7 when the signals ϕTXB3 and ϕSHB are turned on by the control section 6, the signal charge accumulated in the photoelectric conversion element PD is accumulated in the FD 25 through the transfer transistor TQ, and then accumulated in the capacitor CX through the accumulation transistor HQ.

By performing the above operation, all the pixel signals which have been respectively read out by the three rows of the pixel arrays 21-1 through 21-3 with respect to an identical frame are summed up, and accumulated in the capacitor CX and the FD 25. Then, at the timing T8 when the signal φRXB is turned on by the control section 6, the FD 25 is reset, and is brought to a state that a noise (reset noise) component is accumulated. Then, at the timing simultaneously when the signal φRXB is turned on by the control section 6, in other words, at the timing T8 when the signal φRXB is turned on, the signal charge of the noise (reset noise) component after reset of the FD 25 is applied to the amplification transistor GQ as a signal voltage, and is outputted to the corresponding vertical signal line L2 through the color selecting transistor SQ. Then, the outputted noise component is sampled-and-held by the noise sample-and-hold capacitor C2. Then, at the timing T9, the signal φSHB is turned on by the control section 6 in an on-state of the signal φSXB. Thereby, the signal charge accumulated in the capacitor CX flows to the FD 25 through the accumulation transistor HQ. Then, the noise component accumulated in the FD 25, and the signal component as a signal charge accumulated in the capacitor CX are summed up, the summation result is applied to the amplification transistor GQ as a signal voltage, and the signal voltage is outputted to the corresponding vertical signal line L2 through the color selecting transistor SQ. Then, the outputted summation of the noise component and the signal component is sampled-and-held by the signal sample-and-hold capacitor C1.

A pixel signal can be obtained by performing the following process, using a summation of a noise component and a signal component that has been sampled-and-held by the signal sample-and-hold capacitor C1, and a noise component that has been sampled-and-held by the noise sample-and-hold capacitor C2. The amplifier A2 outputs, to the differential amplifier 7, the noise component that has been sampled-and-held by the noise sample-and-hold capacitor C2 in accordance with a column selecting signal to be outputted from the horizontal scanning circuit 4. The amplifier A1 outputs, to the differential amplifier 7, the summation of the noise component and the signal component that has been sampled-and-held by the noise sample-and-hold capacitor C1 in accordance with a column selecting signal to be outputted from the horizontal scanning circuit 4. The differential amplifier 7 removes the noise component from the pixel signal by subtracting the noise component outputted from the amplifier A2, from the summation of the noise component and the signal component that has been outputted from the amplifier A1; and outputs the subtraction result to e.g. the unillustrated A/D converting section provided posterior to the differential amplifier 7.

As described above, the image sensing apparatus of the first embodiment is operable to detect a noise component after resetting the FD 25, and perform a process of adding a signal component to the noise component without resetting the FD 25. Accordingly, the noise component within the summation of the noise component and the signal component that has been sampled-and-held by the signal sample-and-hold capacitor C1 has a value identical to the value of the noise component that has been sampled-and-held by the noise sample-and-hold capacitor C2. This enables to obtain an accurate signal component by subtracting a noise component from a summation of the noise component and a signal component.

Next, a readout operation with respect to pixel signals of G is described. The pixel array 22-1 at the first row of the pixel arrays 22-1 through 22-3 for reading out pixel signals of G reads out a light signal. Specifically, a photoelectric conversion element PD in the pixel array 22-1 receives a light signal, performs a photoelectric conversion operation with respect to the light signal, and accumulates the received light signal as a signal charge. At the timing T7 when the signals φTXG1 and φSHG are turned on by the control section 6, the signal charge accumulated in the photoelectric conversion element PD is accumulated in the FD 25 through the transfer transistor TQ, and then accumulated in the capacitor CX through the accumulation transistor HQ. Thereafter, the pixel array 22-2 at the second row reads out a light signal with respect to the same frame as the frame for which the pixel array 22-1 has performed a readout operation with a time lag from the timing when the light signal has been read out by the pixel array 22-1. Specifically, a photoelectric conversion element PD in the pixel array 22-2 receives a light signal, performs a photoelectric conversion operation with respect to the received light signal, and accumulates the light signal as a signal charge. Then, at the timing T1 when the signals φTXG2 and φSHG are turned on by the control section 6, the signal charge accumulated in the photoelectric conversion element PD is accumulated in the FD 25 through the transfer transistor TQ, and then accumulated in the capacitor CX through the accumulation transistor HQ. Thereafter, the pixel array 22-3 at the third row reads out a light signal with respect to the same frame as the frame for which the pixel arrays 22-1 and 22-2 have performed a readout operation with a time lag from the timing when the light signals have been read out by the pixel arrays 22-1 and 22-2. Specifically, a photoelectric conversion element PD in the pixel array 22-3 receives a light signal, performs a photoelectric conversion operation with respect to the received light signal, and accumulates the light signal as a signal charge. Then, at the timing T4 when the signals φTXG3 and φSHG are turned on by the control section 6, the signal charge accumulated in the photoelectric conversion element PD is accumulated in the FD 25 through the transfer transistor TQ, and then accumulated in the capacitor CX through the accumulation transistor HQ.

By performing the above operation, all the pixel signals which have been readout by the three rows of the pixel arrays 22-1 through 22-3 with respect to an identical frame are accumulated in the corresponding capacitor CX and the corresponding FD 25. Then, at the timing T5 when the signal φRXG is turned on by the control section 6, the FD 25 is reset, and brought to a state that a noise (reset noise) component is accumulated. Then, at the timing simultaneously when the signal φRXG is turned on by the control section, i.e. at the timing T5 when the signal φSXG is turned, the signal charge of the noise (reset noise) component after reset of the FD 25 is applied to the amplification transistor GQ as a signal voltage, and the signal voltage is outputted to the corresponding vertical signal line L2 through the color selecting transistor SQ. Then, the outputted noise component is sampled-and-held by the noise sample-and-hold capacitor C2. Then, at the timing T6, the signal φSHG is turned on by the control section 6 in an on-state of the signal φSXG. Thereby, the signal charge accumulated in the capacitor CX flows to the FD 25 through the accumulation transistor HQ. Then, the noise component accumulated in the FD 25, and the signal component as a signal charge accumulated in the capacitor CX are summed up, the summation result is applied to the amplification transistor GQ as a signal voltage, and the signal voltage is outputted to the corresponding vertical signal line L2 through the color selecting transistor SQ. Then, the outputted summation of the noise component and the signal component is sampled-and-held by the signal sample-and-hold capacitor C1.

Similarly to the readout operation of the pixel signals of B, a pixel signal, whose noise component is removed, can be obtained by using a summation of a noise component and a signal component that has been sampled-and-held by the signal sample-and-hold capacitor C1, and a noise component that has been sampled-and-held by the noise sample-and-hold capacitor C2. The pixel signal is outputted to e.g. the unillustrated A/D converting section provided posterior to the differential amplifier 7.

Next, a readout operation with respect to pixel signals of R is described. The pixel array 23-1 at the first row of the pixel arrays 23-1 through 23-3 for reading out pixel signals of R reads out a light signal. Specifically, a photoelectric conversion element PD in the pixel array 23-1 receives a light signal, performs a photoelectric conversion operation with respect to the light signal, and accumulates the received light signal as a signal charge. At the timing T4 when the signals φTXR1 and φSHR are turned on by the control section 6, the signal charge accumulated in the photoelectric conversion element PD is accumulated in the FD 25 through the transfer transistor TQ, and then accumulated in the capacitor CX through the accumulation transistor HQ. Thereafter, the pixel array 23-2 at the second row reads out a light signal with respect to the same frame as the frame for which the pixel array 23-1 has performed a readout operation with a time lag from the timing when the light signal has been read out by the pixel array 23-1. Specifically, a photoelectric conversion element PD in the pixel array 23-2 receives a light signal, performs a photoelectric conversion operation with respect to the received light signal, and accumulates the light signal as a signal charge. Then, at the timing T7 when the signals φTXR2 and φSHR are turned on by the control section 6, the signal charge accumulated in the photoelectric conversion element PD is accumulated in the FD 25 through the transfer transistor TQ, and then accumulated in the capacitor CX through the accumulation transistor 14Q. Thereafter, the pixel array 23-3 at the third row reads out a light signal with respect to the same frame as the frame for which the pixel arrays 23-1 and 23-2 have performed a readout operation with a time lag from the timing when the light signals have been read out by the pixel arrays 23-1 and 23-2. Specifically, a photoelectric conversion element PD in the pixel array 23-3 receives a light signal, performs a photoelectric conversion operation with respect to the received light signal, and accumulates the light signal as a signal charge. Then, at the timing T1 when the signals φTXR3 and φSHR are turned on by the control section 6, the signal charge accumulated in the photoelectric conversion element PD is accumulated in the FD 25 through the transfer transistor TQ, and then accumulated in the capacitor CX through the accumulation transistor HQ.

By performing the above operation, all the pixel signals which have been read out by the three rows of the pixel arrays 23-1 through 23-3 with respect to an identical frame are accumulated in the corresponding capacitor CX and the corresponding FD 25. Then, at the timing T2 when the signal φRXR is turned on by the control section 6, the FD 25 is reset, and is brought to a state that a noise (reset noise) component is accumulated. Then, at the timing simultaneously when the signal φRXR is turned on by the control section 6, in other words, at the timing T2 when the signal φSXR is turned, the signal charge of the noise (reset noise) component after reset of the FD 25 is applied to the amplification transistor GQ as a signal voltage, and the signal voltage is outputted to the corresponding vertical signal line L2 through the color selecting transistor SQ. Then, the outputted noise component is sampled-and-held by the noise sample-and-hold capacitor C2. Then, at the timing T3, the signal φSHR is turned on by the control section 6 in an on-state of the signal φSXR. Thereby, the signal charge accumulated in the capacitor CX flows to the FD 25 through the accumulation transistor HQ. Then, the noise component accumulated in the FD 25, and the signal component as signal charge accumulated in the capacitor CX are summed up, the summation result is applied to the amplification transistor GQ as a signal voltage, and the signal voltage is outputted to the corresponding vertical signal line L2 through the color selecting transistor SQ. Then, the outputted summation of the noise component and the signal component is sampled-and-held by the signal sample-and-hold capacitor C1.

Similarly to the readout operation of the pixel signals of B, a pixel signal, whose noise component is removed, can be obtained by using a summation of a noise component and a signal component that has been sampled-and-held by the signal sample-and-hold capacitor C1, and a noise component that has been sampled-and-held by the noise sample-and-hold capacitor C2. The pixel signal is outputted to e.g. the unillustrated A/D converting section provided posterior to the differential amplifier 7.

As described above, the image sensing apparatus 1 of the first embodiment has an arrangement, wherein three rows of pixel arrays are provided with respect to each of the color components of R, G, and B. In other words, the image sensing apparatus 1 has nine rows of the pixel arrays 21-1 through 21-3, 22-1 through 22-3, and 23-1 through 23-3. In the case where pixel signals of the respective color components are read out, three pixel signals can be obtained with respect to an identical frame by shifting a readout timing row by row. Accordingly, the image sensing apparatus 1 has a sensitivity three times as high as the sensitivity of an ordinary image sensing apparatus. The image sensing apparatus 1 is provided with the capacitors CX capable of temporarily accumulating electric charges obtained by photoelectric conversion operations by the photoelectric conversion elements PD with respect to the rows of the pixel arrays. This enables to detect a noise component after reset of the FD 25, and a summation of a noise component and a signal component obtained by adding a signal component accumulated in the capacitor CX to the noise component. Accordingly, the image sensing apparatus 1 enables to obtain an accurate signal component, thereby performing a high-precision image sensing operation. Further, since the capacitors CX and the accumulation transistors HQ can be arranged in each of the common circuits KB, KG, and KR, the capacitors CX and the accumulation transistors HQ can be provided without reducing the size of the opening of each pixel. This enables to reduce the size of each pixel. In the image sensing apparatus 1 of the first embodiment, at least one of the capacitor CX and the accumulation transistor HQ may be disposed in each of the pixels, in place of being provided in each of the common circuits KB, KG, and KR. The modification is advantageous in increasing the latitude in layout.

Second Embodiment

In this section, an image sensing apparatus in accordance with the second embodiment of the invention is described. The overall arrangement of the image sensing apparatus in the second embodiment of the invention is substantially identical to that of the image sensing apparatus in the first embodiment of the invention shown in FIG. 1, except for a circuit arrangement of pixels. Accordingly, description of the overall arrangement of the image sensing apparatus in the second embodiment is omitted herein, and the overall arrangement of the image sensing apparatus in the second embodiment is described referring to FIG. 1.

Figure 4:
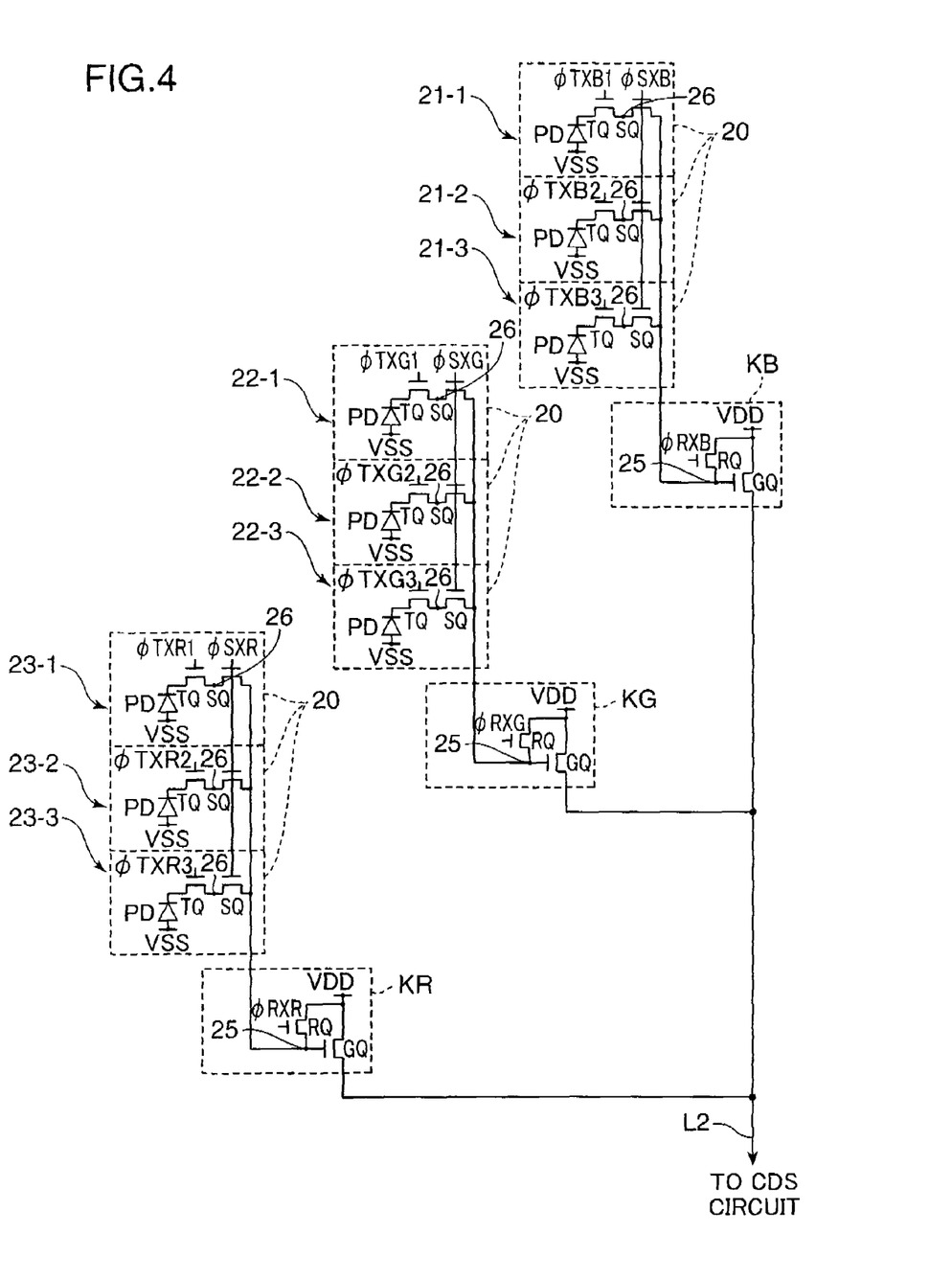
FIG. 4 is a circuit diagram of pixels of an image sensing apparatus in accordance with a second embodiment of the invention.

A circuit arrangement of pixels in the image sensing apparatus in the second embodiment is described referring to FIG. 4. FIG. 4 is a circuit diagram of pixels in the image sensing apparatus in the second embodiment. Referring to FIG. 4, each of pixels 20 included in pixel arrays 21-1 through 21-3, 22-1 through 22-3, and 23-1 through 23-3 is provided with a photoelectric conversion element PD, a transfer transistor TQ, and a color selecting transistor SQ. The photoelectric conversion element PD has an anode being grounded, and a cathode being connected to the source of the transfer transistor TQ. The gate of the transfer transistor TQ is connected to a vertical scanning circuit 3 through a corresponding line selecting line L1. The drain of the transfer transistor TQ is connected to the source of the color selecting transistor SQ, and constitutes a FD (floating diffusion) 26 as a capacitor portion. The photoelectric conversion element PD receives light from an object, and accumulates a signal charge in accordance with the amount of received light. The signal charge which has been accumulated in the photoelectric conversion element PD, and transferred by the transfer transistor TQ may be accumulated in the FD 26. The FD 26 corresponds to an example of an accumulation floating diffusion. The gate of the color selecting transistor SQ is connected to the vertical scanning circuit 3 through a corresponding row selecting signal line L1.

The drain of the color selecting transistor SQ in each of the pixels 20 of the pixel arrays 21-1 through 21-3 is connected to a common circuit KB. The drain of the color selecting transistor SQ in each of the pixels 20 of the pixel arrays 22-1 through 22-3 is connected to a common circuit KG. The drain of the color selecting transistor SQ in each of the pixels 20 of the pixel arrays 23-1 through 23-3 is connected to a common circuit KR.

Signals φTXB1 through φTXB3, as row selecting signals, for controlling on/off of the transfer transistor TQ are inputted to the gate of the transfer transistor TQ in each of the pixels 20 of the pixel arrays 21-1 through 21-3 for reading out pixel signals of B. Signals φTXG1 through φTXG3, as row selecting signals, for controlling on/off of the transfer transistor TQ are inputted to the gate of the transfer transistor TQ in each of the pixels 20 of the pixel arrays 22-1 through 22-3 for reading out pixel signals of G. Signals φTXR1 through φTXR3, as row selecting signals, for controlling on/off of the transfer transistor TQ are inputted to the gate of the transfer transistor TQ in each of the pixels 20 of the pixel arrays 23-1 through 23-3 for reading out pixel signals of R.

A signal φSXB for controlling on/off of the color selecting transistor SQ is inputted to the gate of the color selecting transistor SQ in each of the pixels 20 of the pixel arrays 21-1 through 21-3 for reading out pixel signals of B. A signal φSXG for controlling on/off of the color selecting transistor SQ is inputted to the gate of the color selecting transistor SQ in each of the pixels 20 of the pixel arrays 22-1 through 22-3 for reading out pixel signals of G. A signal φSXR for controlling on/off of the color selecting transistor SQ is inputted to the gate of the color selecting transistor SQ in each of the pixels 20 of the pixel arrays 23-1 through 23-3 for reading out pixel signals of R.

Each of the common circuits KB, KG, and KR is provided with a reset transistor RQ and an accumulation transistor GQ. The drain of the reset transistor RQ and the gate of the amplification transistor GQ are connected to each other, and constitute an FD (floating diffusion) 25. The pixel arrays 21-1 through 21-3, 22-1 through 22-3, and 23-1 through 23-3 are connected to the respective corresponding FDs 25.

The gate of the reset transistor RQ is connected to a control section 6 through a corresponding color selecting signal line L3, and signals φRXB, φRXG, and φRXR to be outputted from the control section 6, and for turning on/off the reset transistor RQ are inputted to the gate of the reset transistor RQ. A drive voltage VDD is inputted to the source of the reset transistor RQ. VDD is outputted from an unillustrated voltage source, and the signals φRXB, φRXG, and φRXR are outputted from e.g. the control section 6. The FD 25 is reset in response to an operation of the reset transistor RQ.

The gate of the amplification transistor GQ is connected to the drain of the color selecting transistor SQ and the drain of the reset transistor RQ through the FD 25. A drive voltage VDD is inputted to the source of the amplification transistor GQ. The drain of the amplification transistor GQ is connected to a corresponding vertical signal line L2, and is connected to a CDS circuit constituted of readout circuits 5 and a differential amplifier 7.

Figure 5:
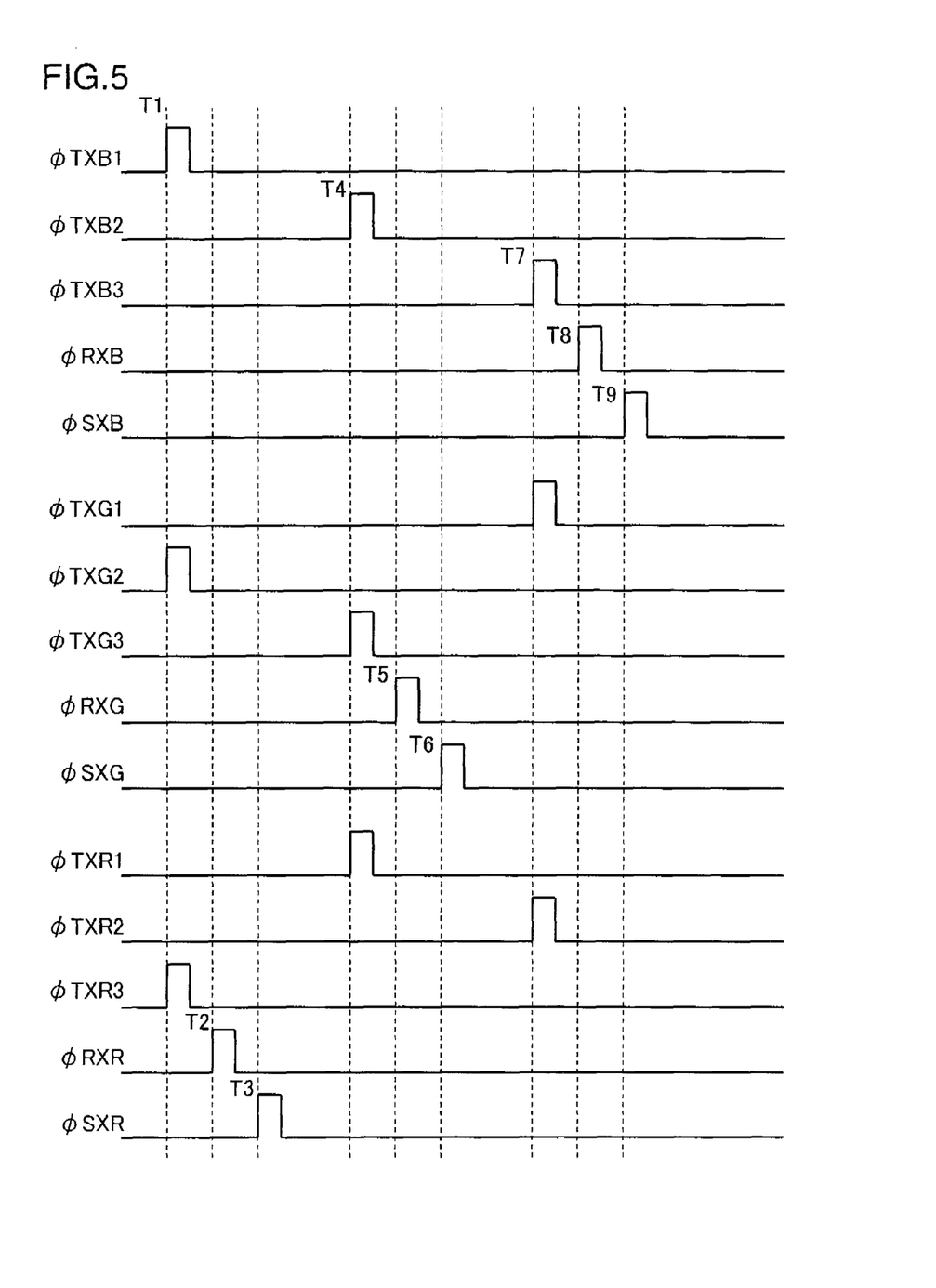
FIG. 5 is a timing chart of signals in the image sensing apparatus shown in FIG. 4.

An operation to be performed by the image sensing apparatus having the above circuit configuration is described referring to FIG. 5. FIG. 5 is a timing chart of signals in the image sensing apparatus of the second embodiment of the invention. First, a readout operation with respect to pixel signals of B is described. The pixel array 21-1 at the first row of the pixel arrays 21-1 through 21-3 for reading out pixel signals of B reads out a light signal. Specifically, a photoelectric conversion element PD in the pixel array 21-1 receives a light signal, performs a photoelectric conversion operation with respect to the light signal, and accumulates the received light signal as a signal charge. At the timing T1 when the signals φTXB1 is turned on by the control section 6, the signal charge accumulated in the photoelectric conversion element PD is accumulated in the FD 26 through the transfer transistor TQ. Thereafter, the pixel array 21-2 at the second row reads out a light signal with respect to the same frame as the frame for which the pixel array 21-1 has performed a readout operation with a time lag from the timing when the light signal has been read out by the pixel array 21-1. Specifically, a photoelectric conversion element PD in the pixel array 21-2 receives a light signal, performs a photoelectric conversion operation with respect to the received light signal, and accumulates the light signal as a signal charge. Then, at the timing T4 when the signals φTXB2 is turned on by the control section 6, the signal charge accumulated in the photoelectric conversion element PD is accumulated in the FD 26 through the transfer transistor TQ. Thereafter, the pixel array 21-3 at the third row reads out a light signal with respect to the same frame as the frame for which the pixel arrays 21-1 and 21-2 have performed a readout operation with a time lag from the timing when the light signals have been read out by the pixel arrays 21-1 and 21-2. Specifically, a photoelectric conversion element PD in the pixel array 21-3 receives a light signal, performs a photoelectric conversion operation with respect to the received light signal, and accumulates the light signal as a signal charge. Then, at the timing T7 when the signals φTXB3 is turned on by the control section 6, the signal charge accumulated in the photoelectric conversion element PD is accumulated in the FD 26 through the transfer transistor TQ.

By performing the above operation, the pixel signals which have been read out by the three rows of the pixel arrays 21-1 through 21-3 with respect to an identical frame are accumulated in the FD 26 in each of the pixels 20. Then, at the timing T8 when the signal φRXB is turned on by the control section 6, the FD 25 in the common circuit KB is reset, and a signal charge of a noise (reset noise) component after reset of the FD 25 is applied to the amplification transistor GQ as a signal voltage, and the signal voltage is outputted to the corresponding vertical signal line L2. Then, the outputted noise component is sampled-and-held by a noise sample-and-hold capacitor C2. Further, at the timing T9 when the signal φSXB is turned on by the control section 6, all the signal components, as a signal charge accumulated in the FDs 26 of the three rows of the pixel arrays 21-1 through 21-3, flow to the corresponding FDs 25. Specifically, the signal charge accumulated in the FDs 26 corresponds to a signal charge obtained by summing up all the pixel signals readout from the three rows of the pixel arrays 21-1 through 21-3 with respect to an identical frame. When a signal component flows to the FD 25, a noise component accumulated in the FD 25 and the signal component are summed up, and the summation result is applied to the amplification transistor GQ as a signal voltage, and the signal voltage is outputted to the corresponding vertical signal line L2. Then, the outputted summation of the noise component and the signal component is sampled-and-held by a signal sample-and-hold capacitor C1.

A pixel signal can be obtained by performing the following process, using a summation of a noise component and a signal component that has been sampled-and-held by the signal sample-and-hold capacitor C1, and a noise component that has been sampled-and-held by the noise sample-and-hold capacitor C2. An amplifier A2 outputs, to the differential amplifier 7, the noise component which has been sampled-and-held by the noise sample-and-hold capacitor C2 in accordance with a column selecting signal to be outputted from a horizontal scanning circuit 4. An amplifier A1 outputs, to the differential amplifier 7, a summation of the noise component and the signal component that has been sampled-and-held by the noise sample-and-hold capacitor C1 in accordance with a column selecting signal to be outputted from the horizontal scanning circuit 4. The differential amplifier 7 removes the noise component from the pixel signal by subtracting the noise component outputted from the amplifier A2, from the summation of the noise component and the signal component that has been outputted from the amplifier A1; and outputs the subtraction result to e.g. an unillustrated A/D converting section provided posterior to the differential amplifier 7.

As described above, the image sensing apparatus of the second embodiment is operable to detect a noise component after resetting the FD 25, and perform a process of adding a signal component to the noise component without resetting the FD 25. Accordingly, the noise component within the summation of the noise component and the signal component that has been sampled-and-held by the signal sample-and-hold capacitor C1 has a value identical to the value of the noise component which has been sampled-and-held by the noise sample-and-hold capacitor C2. This enables to precisely obtain a signal component by subtracting a noise component from a summation of the noise component and a signal component.

Next, a readout operation with respect to pixel signals of G is described. The pixel array 22-1 at the first row of the pixel arrays 22-1 through 22-3 for reading out pixel signals of G reads out a light signal. Specifically, a photoelectric conversion element PD in the pixel array 22-1 receives a light signal, performs a photoelectric conversion operation with respect to the light signal, and accumulates the received light signal as a signal charge. At the timing T7 when the signal φTXG1 is turned on by the control section 6, the signal charge accumulated in the photoelectric conversion element PD is accumulated in the FD 26 through the transfer transistor TQ. Thereafter, the pixel array 22-2 at the second row reads out a light signal with respect to the same frame as the frame for which the pixel array 22-1 has performed a readout operation with a time lag from the timing when the light signal has been read out by the pixel array 22-1. Specifically, a photoelectric conversion element PD in the pixel array 22-2 receives a light signal, performs a photoelectric conversion operation with respect to the received light signal, and accumulates the light signal as a signal charge. Then, at the timing T1 when the signals φTXG2 is turned on by the control section 6, the signal charge accumulated in the photoelectric conversion element PD is accumulated in the FD 26 through the transfer transistor TQ. Thereafter, the pixel array 22-3 at the third row reads out a light signal with respect to the same frame as the frame for which the pixel arrays 22-1 and 22-2 have performed a readout operation with a time lag from the timing when the light signals have been read out by the pixel arrays 22-1 and 22-2. Specifically, a photoelectric conversion element PD in the pixel array 22-3 receives a light signal, performs a photoelectric conversion operation with respect to the received light signal, and accumulates the light signal as a signal charge. Then, at the timing T4 when the signals φTXG3 is turned on by the control section 6, the signal charge accumulated in the photoelectric conversion element PD is accumulated in the FD 26 through the transfer transistor TQ.

By performing the above operation, all the pixel signals which have been read out by the three rows of the pixel arrays 22-1 through 22-3 with respect to an identical frame are accumulated in the FD 26 in each of the pixels 20. Then, at the timing T5 when the signal φRXG is turned on by the control section 6, the FD 25 in the common circuit KG is reset, a signal charge of a reset (reset noise) component after resetting of the FD 25 is applied to the amplification transistor GQ as a signal voltage, and the signal voltage is applied to the corresponding vertical signal line L2. Then, the outputted noise component is sampled-and-held by the noise sample-and-hold capacitor C2. Then, at the timing T6 when the signal φSXG is turned on by the control section 6, all the signal components, as a signal charge accumulated in the FDs 26 of the three rows of the pixel arrays 22-1 through 22-3, flow to the corresponding FD 25. Specifically, the signal charge accumulated in the FDs 26 corresponds to a signal charge obtained by summing up all the pixel signals read out by the three rows of the pixel arrays 22-1 through 22-3 with respect to an identical frame. When a signal component flows to the FD 25, a noise component accumulated in the FD 25 and the signal component are summed up, and the summation result is applied to the amplification transistor GQ as a signal voltage, and the signal voltage is outputted to the corresponding vertical signal line L2. Then, the outputted summation of the noise component and the signal component is sampled-and-held by a signal sample-and-hold capacitor C1.

Similarly to the readout operation of the pixel signals of B, a pixel signal, whose noise component is removed, can be obtained by using a summation of a noise component and a signal component that has been sampled-and-held by the signal sample-and-hold capacitor C1, and a noise component that has been sampled-and-held by the noise sample-and-hold capacitor C2. The pixel signal is outputted to e.g. the unillustrated A/D converting section provided posterior to the differential amplifier 7.

Next, a readout operation with respect to pixel signals of R is described. The pixel array 23-1 at the first row of the pixel arrays 23-1 through 23-3 for reading out pixel signals of R reads out a light signal. Specifically, a photoelectric conversion element PD in the pixel array 23-1 receives a light signal, performs a photoelectric conversion operation with respect to the light signal, and accumulates the received light signal as a signal charge. At the timing T4 when the signal φTXR1 is turned on by the control section 6, the signal charge accumulated in the photoelectric conversion element PD is accumulated in the FD 26 through the transfer transistor TQ. Thereafter, the pixel array 23-2 at the second row reads out a light signal with respect to the same frame as the frame for which the pixel array 23-1 has performed a readout operation with a time lag from the timing when the light signal has been read out by the pixel array 23-1. Specifically, a photoelectric conversion element PD in the pixel array 23-2 receives a light signal, performs a photoelectric conversion operation with respect to the received light signal, and accumulates the light signal as a signal charge. Then, at the timing T7 when the signal φTXR2 is turned on by the control section 6, the signal charge accumulated in the photoelectric conversion element PD is accumulated in the FD 26 through the transfer transistor TQ. Thereafter, the pixel array 23-3 at the third row reads out a light signal with respect to the same frame as the frame for which the pixel arrays 23-1 and 23-2 have performed a readout operation with a time lag from the timing when the light signals have been read out by the pixel arrays 23-1 and 23-2. Specifically, a photoelectric conversion element PD in the pixel array 23-3 receives a light signal, performs a photoelectric conversion operation with respect to the received light signal, and accumulates the light signal as a signal charge. Then, at the timing T1 when the signal φTXR3 is turned on by the control section 6, the signal charge accumulated in the photoelectric conversion element PD is accumulated in the FD 26 through the transfer transistor TQ.

By performing the above operation, all the pixel signals which have been read out by the three rows of the pixel arrays 23-1 through 23-3 with respect to an identical frame are accumulated in the FD 26 in each of the pixels 20. Then, at the timing T2 when the signal φRXR is turned on by the control section 6, the FD 25 in the common circuit KR is reset, and a signal charge of a noise (reset noise) component after reset of the FD 25 is applied to the amplification transistor GQ as a signal voltage, and the signal voltage is outputted to the corresponding vertical signal line L2. Then, the outputted noise component is sampled-and-held by the noise sample-and-hold capacitor C2. Further, at the timing T3 when the signal φSXR is turned on by the control section 6, all the signal components, as a signal charge accumulated in the FDs 26 of the three rows of the pixel arrays 23-1 through 23-3, flow to the corresponding FD 25. Specifically, the signal charge accumulated in the FDs 26 corresponds to a signal charge obtained by summing up all the pixel signals read out by the three rows of the pixel arrays 23-1 through 23-3 with respect to an identical frame. When a signal component flows to the FD 25, a noise component accumulated in the FD 25 and the signal component are summed up, and the summation result is applied to the amplification transistor GQ as a signal voltage, and the signal voltage is outputted to the corresponding vertical signal line L2. Then, the outputted summation of the noise component and the signal component is sampled-and-held by the signal sample-and-hold capacitor C1.

Similarly to the readout operation of the pixel signals of B, a pixel signal, whose noise component is removed, can be obtained by using a summation of a noise component and a signal component that has been sampled-and-held by the signal sample-and-hold capacitor C1, and a noise component that has been sampled-and-held by the noise sample-and-hold capacitor C2. The pixel signal is outputted to e.g. the unillustrated A/D converting section provided posterior to the differential amplifier 7.

As described above, the image sensing apparatus 1 of the second embodiment has an arrangement, wherein three rows of pixel arrays are provided with respect to each of the color components of R, G, and B. In other words, the image sensing apparatus 1 has nine rows of the pixel arrays 21-1 through 21-3, 22-1 through 22-3, and 23-1 through 23-3. In the case where pixel signals of the respective color components are read out, three pixel signals can be obtained with respect to an identical frame by shifting a readout timing row by row. Accordingly, the image sensing apparatus 1 has a sensitivity three times as high as the sensitivity of an ordinary image sensing apparatus. The image sensing apparatus 1 is provided with the FD 26, in each of the pixels 20, capable of temporarily accumulating an electric charge obtained by a photoelectric conversion operation by the photoelectric conversion element PD with respect to each row of the pixel arrays. This enables to detect a summation of a noise component and a signal component obtained by adding a signal component accumulated in the FD 26 to a noise component obtained after resetting the FD 25 in each of the common circuits KB, KG, and KR. Thus, the image sensing apparatus 1 in the second embodiment enables to obtain an accurate signal component, thereby performing a high-precision image sensing operation.

Figure 6:
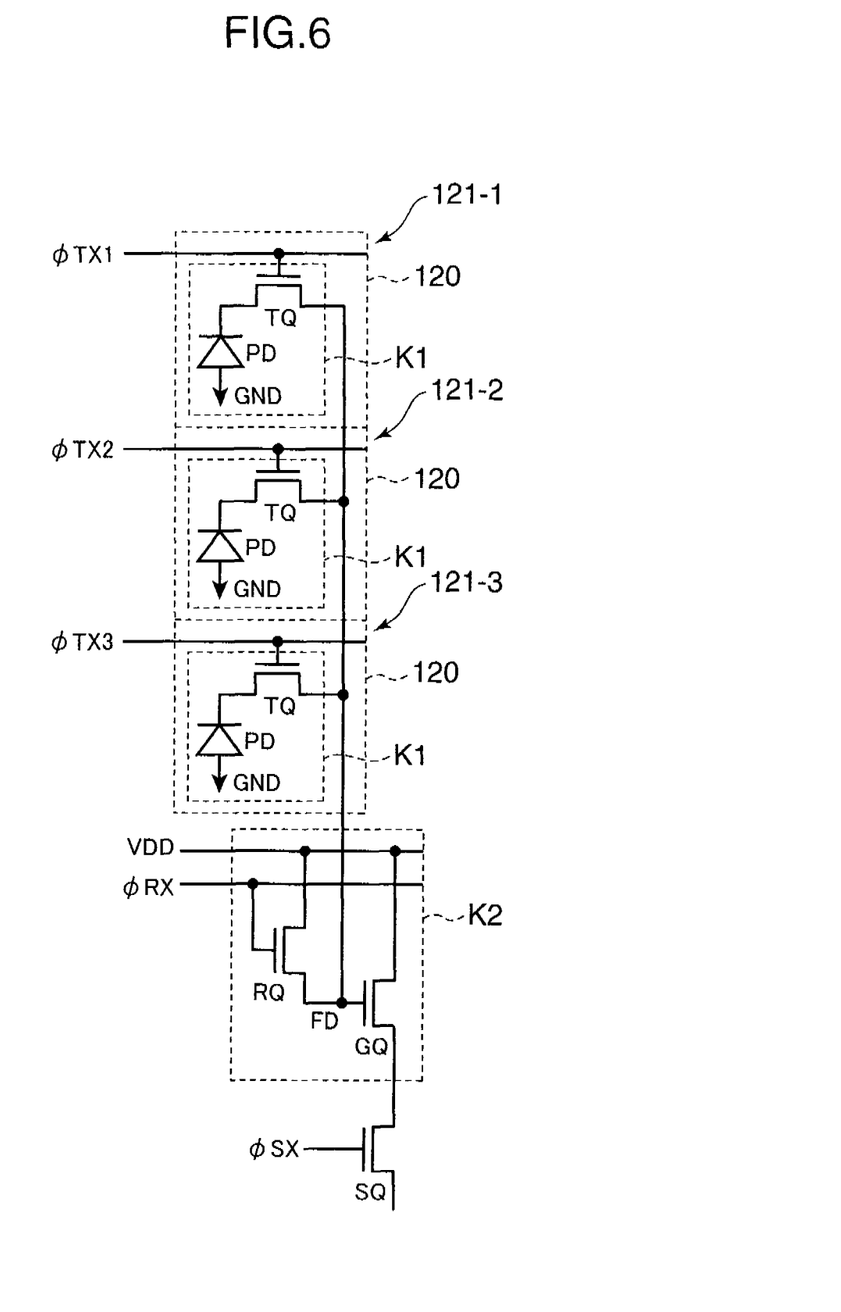
FIG. 6 is a circuit diagram of pixels of a solid state image sensor.
Figure 7:
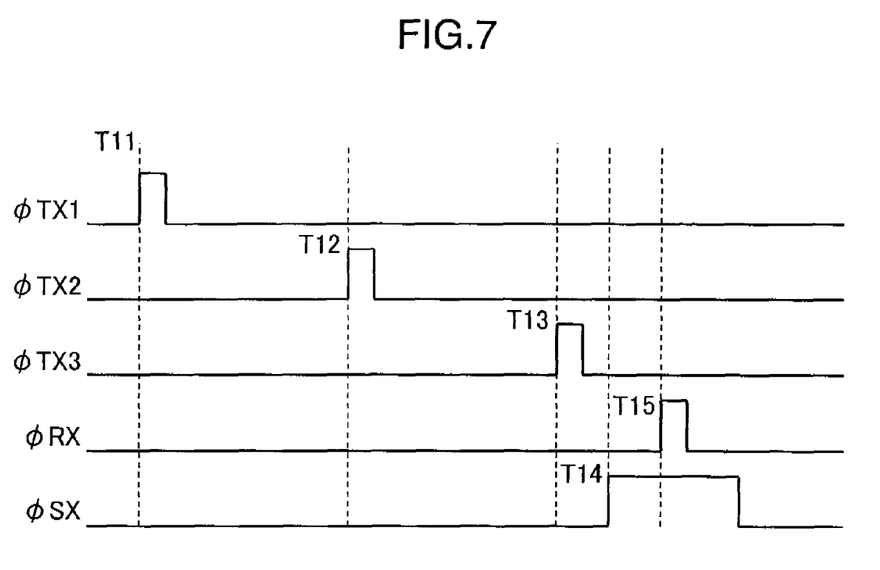
FIG. 7 is a timing chart of signals in a pixel circuit of the solid state image sensor.

In the following, comparison between a solid state image sensor for performing a TDI operation, as shown in FIGS. 6 and 7, and the solid state image sensors in accordance with the first and the second embodiments is described.

In the solid state image sensor shown in FIGS. 6 and 7, a circuit element identical between the pixels is not disposed in each of the pixels, and a circuit shared by the pixels is disposed at an exterior of the pixels. This enables to reduce an area of the pixel circuits in the pixels. A solid state image sensor having the above arrangement is advantageous in increasing the area of the openings in the pixels. Thus, the solid state image sensor enables to reduce the area of pixel arrays by the size corresponding to the circuit elements disposed at the exterior of the pixels, without reducing the area of the openings in the pixels. Accordingly, a CMOS image sensor having the above arrangement is advantageous in receiving the sufficient amount of light while keeping the conventional size of the openings, and reducing the pitch between the pixel arrays. The CMOS image sensor has plural pixel arrays for receiving light of a corresponding color component (spectral characteristic) with respect to an object in order to perform a TDI operation. A readout operation with respect to an identical frame is performed by shifting a readout time row by row. In other words, as compared with an ordinary CMOS image sensor constructed such that one row of pixel array receives light of a corresponding color component, the CMOS image sensor for performing a TDI operation reads out information of multiple times corresponding to the number of readout times by the TDI operation. Accordingly, the CMOS image sensor for performing a TDI operation has a sensitivity of the multiple times, as compared with the ordinary CMOS image sensor. The TDI operation is realized by well-known and conventional means. For instance, the technology is disclosed in e.g. the following literatures.

"Feature of Backside Incident type TDI-CCD" by Hamamatsu Photonics KK (searched on Feb. 16, 2009) by the Internet <URL:http://jp.hamamatsu.com/products/sensor-assd/pd101/pd457/index_ja.html>, and "Feature and Usage of Backside Incident type TDI-CCD" April, 2007 by Hamamatsu Photonics KK (searched on Feb. 16, 2009) by the Internet <URL:http://jp. hamamatsu.com/resources/products/ssd/pdf/tdi-ccd_kmpd9004j01.pdf>.

The literatures disclose a TOT operation, wherein an TDI CCD performs a vertical transfer operation of electric charges in the unit of rows at the time of performing a readout operation of electric charges, and the electric charge transfer timing and a timing of shifting object light to be incident into the CCD are made coincident with each other to perform integration exposure with respect to a predetermined number of rows of CCD pixels in vertical direction.

Next, a sequence of reading out electric charges from the solid state image sensor shown in FIGS. 6 and 7 is described. FIG. 6 is a circuit diagram of pixels in the solid state image sensor, and FIG. 7 is a timing chart of signals from a pixel circuit in the solid state image sensor.

Referring to FIG. 6, the solid state image sensor has three rows of pixel arrays 121-1 through 121-3 to read out pixel signals of B (Blue). In FIG. 6, only three pixels out of the pixel arrays are shown to simplify the description. The solid state image sensor is also provided with pixel arrays for reading out pixel signals of G (Green) and R (Red). However, since the pixel arrays for reading out pixel signals of G and R perform the same operation as the pixel arrays 121-1 through 121-3 for reading out pixel signals of B, illustration and description thereof are omitted herein. A pixel circuit K1 having a photodiode PD for accumulating a signal charge in accordance with the amount of received light, and a transfer transistor TQ is arranged in each of pixels 120 of the pixel arrays 121-1 through 121-3. The anode of each photodiode PD is grounded, and the cathode thereof is connected to the source of the transfer transistor TQ. The gate of the transfer transistor TQ is connected to an unillustrated vertical scanning circuit, and transfer signals φTX1 through φTX3 are inputted to the transfer gate of the transfer transistor TQ. A common pixel circuit K2 commonly provided for the pixel arrays 121-1 through 121-3 is provided at the exterior of the pixel arrays 121-1 through 121-3. A reset transistor RQ, an amplification transistor GQ, and a color selecting transistor SQ are provided in the common pixel circuit K2. The drain of the reset transistor RQ and the gate of the amplification transistor GQ are connected to each other, and constitute an FD (floating diffusion). A signal φRX for turning on/off the reset transistor RQ is inputted to the gate of the reset transistor RQ, and a drive voltage VDD is inputted to the source of the reset transistor RQ. The reset transistor RQ is turned on/off in response to the signal φRX to reset the FD.

The gate of the amplification transistor GQ is connected to the transfer transistor TQ and the reset transistor RQ through the FD. A drive voltage VDD is inputted to the source of the amplification transistor GQ, and the drain of the amplification transistor GQ is connected to the source of the color selecting transistor SQ. A signal φSX for turning on/off the color selecting transistor SQ is inputted to the gate of the color selecting transistor SQ. The drain of the color selecting transistor SQ is connected to an unillustrated CDS (Correlated Double Sampling) circuit. As described above, actually, the solid state image sensor is also provided with the pixels for reading out pixel signals of G and R, and each of the pixel arrays has a corresponding color selecting transistor SQ to control whether a pixel signal having a color component of one of R, G, and B is to be inputted to the CDS circuit by controlling on/off of the respective corresponding color selecting transistors SQ.

An operation to be performed by the circuit configuration of the solid state image sensor is described referring to the timing chart of the signals shown in FIG. 7. In response to input of light to each of the pixels, the corresponding PD accumulates an electric charge in accordance with the amount of received light. Then, as shown in FIG. 7, at the timing T11 when the signal φTX1 is turned on, the electric charge accumulated in the PD of the pixel 120 of the pixel array 121-1 is transferred to the FD, and accumulated in the FD. Then, at the timings T12 and T13 when the signals φTX2 and φTX3 are successively turned on, the electric charges accumulated in the PDs of the pixels 120 of the pixel arrays 121-1 through 121-3 are transferred to the corresponding FD, and accumulated in the FD. In other words, all the electric charges generated in the pixel arrays 121-1 through 121-3 are accumulated in the FD. Then, at the timing T14 when the signal φSX is turned on, the electric charge accumulated in the FD is outputted to the CDS circuit as a signal voltage through the amplification transistor GQ. In performing the above operation, the signal voltage to be outputted includes a reset noise (kTC noise) component in the FD, and a signal charge component transferred from the pixels. Then, at the timing T15 when the signal φRX is turned on in an on-state of the signal φSX, the FD is reset, and only the reset noise component is accumulated in the FD. Thereby, the signal voltage only composed of the reset noise is outputted to the CDS circuit. Then, the CDS circuit obtains a pixel signal by subtracting the signal voltage only composed of the reset noise, from the signal voltage including the reset noise component and the signal charge component transferred from the pixels 120, as a preceding output. In this arrangement, there is no likelihood that pixel signals of R, G, and B are mixed with each other by differentiating the timing of outputting the pixel signals (not shown) from pixel arrays corresponding to the other color components to the CDS circuit by the respective corresponding color selecting transistors SQ. Thus, the solid state image sensor enables to realize a sensitivity of three times as high as the sensitivity of an ordinary solid state image sensor.

In this embodiment, in the solid state image sensor shown in FIGS. 6 and 7, the differential operation to be executed by the CDS circuit is performed, using a signal voltage including a reset noise component, and a signal charge component transferred from the pixels 120, and a signal voltage composed of a reset noise. However, it is not always the case that the value of a reset noise in a signal voltage including a reset noise component, and a signal charge component transferred from the pixels 120, as a preceding output from the CDS circuit, and the value of a reset noise to be outputted as a succeeding output are identical to each other. Specifically, the signal voltage as a preceding output is obtained before resetting the FD, and the signal voltage as a succeeding output is obtained after resetting the FD. Accordingly, there is a case that the value of the reset noise component included in the signal voltage as a preceding output, and the value of the signal voltage composed of a reset noise to be outputted as a succeeding output are different from each other. Thus, the differential operation to be performed using these signal voltages may not completely remove a reset noise, and a noise may be included in a pixel signal to be outputted from the CDS circuit, which fails to provide a high-precision image sensing operation.

The solid state image sensor shown in FIGS. 6 and 7 performs a TDI operation. Accordingly, it is necessary to sum up and accumulate all the signal charges from the pixels 120 of the three rows of the pixel arrays 121-1 through 121-3 in the FD. Thus, the solid state image sensor shown in FIGS. 6 and 7 is incapable of resetting the FD before outputting, to the CDS circuit, a signal voltage including a signal charge component transferred from the pixels 120. Unlike the solid state image sensor shown in FIGS. 6 and 7, as described above, the solid state image sensors of the first and the second embodiments solve the aforementioned drawbacks.

The specification discloses the aforementioned arrangements. The following is a summary of the primary arrangements of the embodiments.

A solid state image sensor according to an aspect includes: a plurality of pixel arrays, each having a plurality of pixels arranged in a one-dimensional manner, and adapted to receive light of a corresponding color with respect to an object at timings different from each other; an accumulating section which accumulates signal charges obtained by exposure of the object at the different timings by the pixels of each of the pixel arrays; a converting floating diffusion commonly provided for the pixels of each of the pixel arrays, and adapted to accumulate the signal charges summed up and transferred from the accumulating section to convert the signal charges into a signal voltage; a reset transistor which resets the converting floating diffusion; and an amplification transistor which amplifies the signal charges accumulated in the converting floating diffusion to output the amplified signal charges as a signal voltage. Specifically, resetting the floating diffusion means applying a reset bias voltage to the floating diffusion.

In the solid state image sensor having the above arrangement, the accumulating section sums up and accumulates signal charges obtained by exposure of an object with respect to a corresponding color at different timings by the pixels of each of the pixel arrays. A reset noise of the converting floating diffusion is outputted after the converting floating diffusion is reset. Thereafter, a summation of the reset noise, and the signal charges accumulated in the accumulating section is outputted. Thus, in the solid state image sensor, the value of a reset noise, as a preceding output from the amplification transistor, and the value of a reset noise included in a succeeding output are identical to each other. Accordingly, the solid state image sensor enables to obtain an accurate pixel signal by obtaining a difference between the succeeding output and the preceding output.

In the solid state image sensor, preferably, the accumulating section may be a capacitor element.

In the above arrangement, since the accumulating section is operable to sum up and accumulate signal charges being transferred, as necessary, it is possible to sum up and accumulate signal charges obtained by exposure of an object at different timings by the pixels of each of the pixel arrays. Further, since the accumulating section is operable to easily transfer the accumulated signal charges, the accumulated signal charges can be transferred to the converting floating diffusion.

In the solid state image sensor, preferably, the accumulating section may be an accumulating floating diffusion provided in each of the pixels.

In the above arrangement, since the accumulating section is operable to sum up and accumulate signal charges being transferred, as necessary, it is possible to sum up and accumulate signal charges obtained by exposure of an object at different timings by the pixels of each of the pixel arrays. Further, since the accumulating section is operable to easily transfer the accumulated signal charges, the accumulated signal charges can be transferred to the converting floating diffusion.

In the solid state image sensor, preferably, the accumulating section may be commonly provided for the pixels of each of the pixel arrays, and may be disposed at an exterior of the pixels.

In the above arrangement, there is no likelihood that the size of the circuits in the pixels may be unduly increased in the solid state image sensor. Accordingly, there is no likelihood that the opening ratio in the pixels may be reduced, without increasing the area of the pixels.

In the solid state image sensor, preferably, the pixels of each of the pixel arrays may receive the signal charges obtained by the exposure of the object at the timings different from each other with respect to the corresponding color, the accumulating section may accumulate the received signal charges, the reset transistor may reset the converting floating diffusion during a time when the signal charges are accumulated in the accumulating section, the amplification transistor may output a noise component accumulated in the reset converting floating diffusion, as the signal voltage, the accumulating section may transfer the summed-up signal charges to the converting floating diffusion, after the noise component is outputted from the amplification transistor, as the signal voltage, and the amplification transistor may output a noise component accumulated in the converting floating diffusion, and a summation of the signal charges and the noise component, as the signal voltage.

In the above arrangement, the preceding output from the amplification transistor is a reset noise of the converting floating diffusion. The value of the preceding output is identical to the value of a reset noise included in the succeeding output. Accordingly, the solid state image sensor having the above arrangement enables to obtain an accurate pixel signal by obtaining a difference between the succeeding output and the preceding output.

An image sensing apparatus according to another aspect includes the solid state image sensor having any one of the above arrangements, and a control section which controls an image sensing operation of the solid state image sensor.

In the image sensing apparatus having the above arrangement, the value of the reset noise as the preceding output from the amplification transistor, and the value of the reset noise included in the succeeding output are identical to each other. Accordingly, the image sensing apparatus having the above arrangement enables to obtain an accurate pixel signal by obtaining a difference between the succeeding output and the preceding output.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A solid state image sensor comprising:
a plurality of pixel arrays, each having a plurality of pixels arranged in a one-dimensional manner, and adapted to receive light of a corresponding color with respect to an object at timings different from each other;
an accumulating section which accumulates pixel signal charges obtained by exposure of the object at the different timings by the pixels of all of the pixel arrays adapted to receive light of the same color;
a converting floating diffusion commonly provided for the pixels of all of the pixel arrays adapted to receive light of the same color, and adapted to accumulate the pixel signal charges summed up and transferred from the accumulating section to convert the pixel signal charges into a signal voltage;
a reset transistor which resets the converting floating diffusion during a time when the pixel signal charges are accumulated in the accumulating section;
an amplification transistor which amplifies the pixel signal charges accumulated in the converting floating diffusion to output the amplified pixel signal charges as a signal voltage;
a read out circuit receiving the signal voltage output from the first amplification transistor, the read out circuit comprising pairs of switch circuits receiving the signal voltage output from the first amplification transistor, an output of a first switch circuit of each pair of switch circuits being combined as a first read out circuit output, an output of a second switch circuit of each pair of switch circuits being combined as a second read out circuit output;

a differential amplifier receiving the first and second read out circuit outputs and subtracting the second read out circuit output from the first read out circuit output; and a control section which controls the pairs of switches of the read out circuit such that the first read out circuit output is a combination of the signal voltage corresponding to a selected pixel and a reset noise of the converting floating diffusion with respect to the selected pixel, and such that the second read out circuit output is the reset noise, wherein the accumulating section and the converting floating diffusion are disposed exterior of the pixels.

2. The solid state image sensor according to claim 1, wherein the accumulating section comprises a capacitor element.

3. The solid state image sensor according to claim 1, further comprising an accumulating floating diffusion provided in each of the pixels.

* * * * *